(12) United States Patent
Miyabe et al.

(10) Patent No.: US 6,476,680 B2
(45) Date of Patent: Nov. 5, 2002

(54) CASCODE AMPLIFYING CIRCUIT AND FOLDED CASCODE AMPLIFYING CIRCUIT

(75) Inventors: Satoru Miyabe, Tokyo (JP); Yasuhiro Sugimoto, 34-3, Kawawadai, Tsuzuki-ku, Yokohama-shi, Kanagawa-ken (JP)

(73) Assignees: Nippon Precision Circuits, Inc., Tokyo (JP); Yasuhiro Sugimoto, Yokahama (JP)

( * ) Notice: Subject to any disclaimer, the term of this patent is extended or adjusted under 35 U.S.C. 154(b) by 0 days.

(21) Appl. No.: 09/992,336

(22) Filed: Nov. 6, 2001

(65) Prior Publication Data

US 2002/0067213 A1 Jun. 6, 2002

(30) Foreign Application Priority Data

Nov. 24, 2000 (JP) ........................................ 2000-357699

(51) Int. Cl.[7] .............................. H03F 3/04; H03F 3/45
(52) U.S. Cl. ........................ 330/311; 330/253; 330/261
(58) Field of Search ................................ 330/253, 261, 330/311

(56) References Cited

U.S. PATENT DOCUMENTS 4,366,446 A * 12/1982 Henderson et al. ......... 330/260
5,304,946 A * 4/1994 Sano et al. ................. 330/254
5,345,346 A * 9/1994 Brannon et al. ............ 330/254
6,177,838 B1 * 1/2001 Chiu .......................... 330/253

* cited by examiner

Primary Examiner—Patricia Nguyen
(74) Attorney, Agent, or Firm—Jordan and Hamburg LLP

(57) ABSTRACT

To provide a cascode amplifying circuit having large amplifying gain without narrowing an output operational range or deteriorating response performance of the circuit even with a constitution by a small number of elements is achieved by applying negative feedback from the source to the gate of an MOS transistor M2 provided with an output terminal at the drain via the source and the drain of an MOS transistor M3 of N-channel type, the source and the drain of an MOS transistor M4 of P-channel type and a current mirror constituted by MOS transistors M5 and M6 of N-channel type. By this constitution, operation of the MOS transistor M3 is not effected with influence of lowering of voltage of the source of the MOS transistor M2, a wide output operational range is provided and mirror effect with respect to gate/drain capacitance of the MOS transistor is restrained to thereby restrain a reduction in response speed.

4 Claims, 4 Drawing Sheets

Vb1, Vb2; FIXED BIAS VOLTAGE

Vb6, Vb7, Vb8 ; FIXED BIAS VOLTAGE

CASCODE AMPLIFYING CIRCUIT AND FOLDED CASCODE AMPLIFYING CIRCUIT

BACKGROUND OF THE INVENTION

1. Field of the Invention

The present invention relates to a cascode amplifying circuit and a folded cascode amplifying circuit.

2. Description of the Related Art

Currently, a cascode amplifying circuit constituted by MOS transistors is widely utilized with an increase in operational frequency of various integrated circuit apparatus since delay of signal by influence of a gate capacitance is comparatively inconsiderable.

According to a basic constitution of a cascode amplifying circuit, as shown by FIG. 5, MOS transistors m1 and m2 of the same conductive type, for example, N-channel type are connected in cascode, an input signal is applied to the gate of the MOS transistor m1 on a side of connecting the source to a power source terminal VSS (0V), and an output terminal is provided to the drain of the MOS transistor m2 the drain of which is connected with a current source and the gate of which is applied with bias voltage. Amplifying gain of such a cascode amplifying circuit is increased by applying negative feedback from the source to the gate of the output transistor of the cascode amplifying circuit. A description will be given thereof as follows.

In FIG. 5, the gate terminal of the MOS transistor m2 is applied with fixed bias voltage Vbias. Now, when transfer conductances of the MOS transistors m1 and m2 are respectively designated by notations $gm_1$ and $gm_2$, output resistance values thereof are respectively designated by notations $r_{01}$ and $r_{02}$, further, an output resistance value of the cascode amplifying circuit is designated by notation $r_0$, the amplifying gain of the cascode amplifying circuit is represented by $gm_1 \cdot r_0$. Here, when $r_0$ is represented by $r_{01}$ and $r_{02}$, the following equation is established.

$$r_0 = r_{01} + (1 + gm_2 \cdot r_{01}) \cdot r_{02} \approx gm_2 \cdot r_{01} \cdot r_{02} \quad (1)$$

Therefore, the amplifying gain of the cascode amplifying circuit is represented by the following equation.

$$gm_1 \cdot r_0 \approx gm_1 \cdot gm_2 \cdot r_{01} \cdot r_{02} \quad (2)$$

Now, when negative feedback having gain A is applied from the source to the gate of the MOS transistor m2 instead of applying the fixed bias voltage Vbias to the gate terminal of the MOS transistor m2, the output resistance value $r_0$ is changed as follows.

$$r_0 = r_{01} + (1 + (1+A) \cdot gm_2 \cdot r_{01}) \cdot r_{02} \approx A \cdot gm_2 \cdot r_{01} \cdot r_{02} \quad (3)$$

Therefore, the amplifying gain of the cascode amplifying circuit becomes as follows.

$$gm_1 \cdot r_0 \approx A \cdot gm_1 \cdot gm_2 \cdot r_{01} \cdot r_{02} \quad (4)$$

It is known that the amplifying gain is increased by a multiplication factor of about A by applying the negative feedback. This can be changed to state as follows. That is, although the change in the output resistance value of the MOS transistor m2 in accordance with the change in the output value of the cascode amplifying circuit, brings about the change in source voltage of the MOS transistor m2, the negative feedback from the source to the gate of the MOS transistor m2 operates to restrain a change depending on an output value of the output resistance value of the MOS transistor m2. As a result, the output resistance of the cascode amplifying circuit looks as high resistance and the amplifying gain is increased.

Meanwhile, an operational range of the output of the circuit of FIG. 5 is determined by a condition by which the MOS transistor m1 is brought into a saturated region. That is, when voltage of a drain node x of the MOS transistor m1 is designated by notation Vx, gate/source voltage of the MOS transistor m1 is designated by $Vgs_1$ and threshold voltage thereof is designated by notation $Vth_1$, the operational range is prescribed by $Vx > Vgs_1 - Vth_1$.

In an actual cascode amplifying circuit, the above-described negative feedback is realized as shown by FIG. 6 and FIG. 7.

FIG. 6 shows a cascode amplifying circuit increasing amplifying gain by the simplest constitution. According to the constitution, a cascode amplifying circuit comprising the MOS transistors m1 and m2 and an active load $i_1$, is applied with negative feedback by an amplifying circuit comprising an MOS transistor m3 and an active load $i_2$. Now, when the resistance value of the MOS transistor m2 is reduced by, for example, a change in output voltage, although voltage of the node x starts increasing, the gate voltage of the MOS transistor m2 is reduced by operation of the negative feedback and accordingly, the resistance value of the MOS transistor m2 is restrained from reducing. In this way, the negative feedback by the amplifying circuit comprising the MOS transistor m3 and the active load $i_2$, operates to restrain the change in the resistance value of the MOS transistor m2 and achieves an effect of increasing the amplifying gain. However, in the circuit of FIG. 6, the voltage Vx of the drain x of the MOS transistor m1 must satisfy at least a voltage relationship of $Vx > Vth_3$ (notation $Vth_3$ designates threshold voltage of the MOS transistor m3) in order to guarantee operation of the MOS transistor m3 and there poses a problem that an output operational range becomes narrower than that in the case of the circuit of FIG. 5. Further, there poses a problem that frequency of pole at the node x is lowered and response of the cascode amplifying circuit is delayed by a mirror effect with respect to gate/drain capacitance of the MOS transistor m3. Furthermore, although according to the constitution of FIG. 6, the source terminal voltage Vx of the MOS transistor m2 is determined by the MOS transistor m3 and the active load $i_2$, there also poses a problem that the value of Vx is dispersed by device dispersion of the MOS transistor m3 or a change in a value of the active load $i_2$.

FIG. 7 shows a cascode amplifying circuit improved to increase amplifying gain while avoiding the problems of the circuit of FIG. 6. According to the constitution, in the cascode amplifying circuit comprising the MOS transistors m1 and m2 and the active load $i_1$, negative feedback is applied to the transistor m2 by a folded cascode amplifying circuit constituted by using the MOS transistor m3 having a conductive type reverse to that of the MOS transistors m1 and m2. Since the MOS transistor m3 is the MOS transistor having the conductive type reverse to that of the MOS transistor m1, there is achieved an advantage that lowering of the drain voltage of the MOS transistor m1 does not hamper operation of the MOS transistor m3 and the output voltage range of the cascode amplifying circuit is not narrowed by the negative feedback circuit. Further, since the drain node of the MOS transistor m3 is connected to the source of an MOS transistor m12 in cascode, there is achieved an advantage that the mirror effect with respect to the gate/drain capacitance of the MOS transistor m3 is restrained. Further, the negative feedback portion of FIG. 7 is provided with a differential input portion constituted by the MOS transistor m3 and an MOS transistor m11 and accordingly, there is achieved an advantage that by applying fixed bias voltage to the gate terminal of the MOS transistor m11, the source terminal voltage of the MOS transistor m2 can be adjusted.

However, a large number of transistor elements are needed in the constitution of FIG. 7 and not only the circuit scale is excessively large but also the constitution is constructed by a multiple stage series connection of the transistors and accordingly, there poses a problem that operation at low power source voltage becomes difficult.

SUMMARY OF THE INVENTION

According to an aspect of the invention, there is provided a cascode amplifying circuit comprising a first, a second and a third MOS transistor having a same conductive type, and a fourth MOS transistor having a conductive type reverse thereto, wherein a source of the second MOS transistor is connected to a drain of the first MOS transistor and a drain of the second MOS transistor is connected to an output terminal, there is provided a differential amplifying circuit a first differential input terminal of which is constituted by a gate of the third MOS transistor, a second differential input terminal of which is constituted by a source thereof and a differential output terminal of which is constituted by a drain thereof, there is provided a load circuit constituted by connecting a source of the fourth MOS transistor to the differential output terminal, there is provided an inverted amplifying circuit for invertedly amplifying an output from the differential output terminal via the load circuit, and there is provided a negative feedback circuit from the source of the second MOS transistor to a gate thereof by applying a predetermined fixed bias voltage to the first differential input terminal, connecting the second differential input terminal to the source of the second MOS transistor and connecting the output terminal of the inverted amplifying circuit to the gate of the second MOS transistor.

According to another aspect of the invention, in the cascode amplifying circuit, it is preferable that an input terminal is constituted by a gate of the first MOS transistor and it is also preferable that an input terminal is provided to a connection point connecting the second differential input terminal of the differential amplifying circuit and the source of the second MOS transistor and a signal current is applied to the input terminal.

Further, according to another aspect of the invention, there is provided a folded cascode amplifying circuit comprising a first through a fourth circuit each comprising the cascode amplifying circuit, wherein each of the first through the third MOS transistors in the first and the second circuits is of a first conductive type and the fourth MOS transistor is of a second conductive type reverse to the first conductive type, each of the first and the third MOS transistors in the third and the fourth circuits is of the second conductive type and the fourth MOS transistor is of the first conductive type, a first common output terminal is constituted by connecting the respective drains of the second respective MOS transistors in the first and the third circuits, a second common output terminal is constituted by connecting the respective drains of the second respective MOS transistors in the second and the fourth circuits, the respective sources of the second respective MOS transistors in the first and the second circuits or the respective sources of the second respective MOS transistors in the third and the fourth circuits are respectively connected to a first and a second input terminal, there is provided a differential circuit constituted by commonly connecting respective sources of a fifth and a sixth respective MOS transistors, respective drains of the fifth and the sixth respective MOS transistors are respectively connected to the first and the second input terminals, the fifth and the sixth respective MOS transistors are of a conductive type reverse to the conductive type of the second respective MOS transistors provided with the first and the second input terminals, a first and a second common input terminal are respectively constituted by respective gates of the fifth and the sixth respective MOS transistors, and an input signal is applied to the first and the second respective common input terminals and an output signal is generated from the first and the second respective common output terminals.

DETAILED DESCRIPTION OF THE PREFERRED EMBODIMENTS

Figure 1:
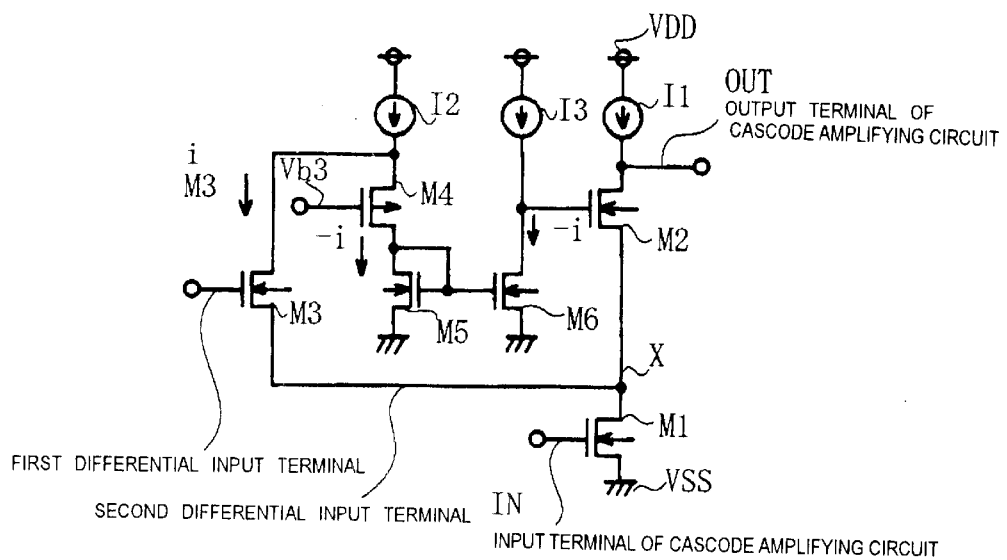
FIG. 1 is a circuit diagram showing a constitution of a cascode amplifying circuit according to a first embodiment of the invention.

A detailed explanation will be given of a mode of carrying out the invention based on embodiments in reference to the drawings as follows. FIG. 1 is a circuit diagram showing a cascode amplifying circuit according to a first embodiment of the invention. An output portion of the cascode amplifying circuit is constituted by two of N-channel type MOS transistors M1 and M2 having the same conductive type and an active load $I_1$. The gate of the MOS transistor M1 is provided with an input terminal IN and the drain of the MOS transistor M2 is provided with an output terminal OUT. The source of the MOS transistor M2 is connected with the source of an MOS transistor M3 of the same N-channel type. The drain of the MOS transistor M3 is connected with an active load $I_2$ constituting a constant current source and the source of an MOS transistor M4 of a conductive type reverse to that of the MOS transistor M3, in this case, P-channel type. The drain of the MOS transistor M4 is connected with the drain and the gate of an MOS transistor M5 of a conductive type the same as that of the MOS transistor M3 and the gate of an MOS transistor M6 of a conductive type the same as that of the MOS transistor M5, the drain of the MOS transistor M6 is connected to an active load $I_3$ and connected to the gate of the MOS transistor M2. The gates of the MOS transistor M3 and the MOS transistor M4 are applied with predetermined fixed bias voltage and the sources of the MOS transistors M5 and M6 are connected to a power source terminal VSS (0V).

The MOS transistors M1 and M2 are first and second MOS transistors. The MOS transistor M3 is a third MOS transistor, the gate is a first differential input terminal and the source is a second differential input terminal constituting a differential amplifying circuit. The MOS transistor M4 is a fourth MOS transistor constituting a load circuit along with the MOS transistor M5. The MOS transistor M5 constitutes a current mirror along with the MOS transistor M6. The MOS transistor M6 and the active load $I_3$ constitute an inverted amplifying circuit.

Next, an explanation will be given of operation of the example.

A voltage variation of a node x constituting the source of the MOS transistor M2 is transmitted to the second input terminal of the differential amplifying circuit (that is, source of the MOS transistor M3). When small signal alternating current input voltage to the first input terminal of the differential amplifying circuit is designated by notation $v_1$, small signal alternating current input voltage to the second input terminal of the differential amplifying circuit is designated by notation $v_2$, transfer conductance of the MOS transistor M3 is designated by notation $gm_{M3}$, drain/source small signal alternating current of the MOS transistor M3 is designated by notation $i_{ds}$ and source/drain small signal alternating current is designated by notation $i_{sd}$, small signal output current $i_{ds}$ (M3) of the MOS transistor M3 is represented as follows and differential amplification is executed at the MOS transistor M3.

$$i_{ds}(M3)=gm_{M3}(v_1-v_2) \quad (5)$$

A variation in the output resistance value of the MOS transistor M2 is transmitted to the second input terminal of the differential amplifying circuit (source of MOS transistor M3) as a voltage variation of the node x constituting the source of the MOS transistor M2. The first input terminal of the first differential amplifying circuit is applied with fixed bias voltage, $v_1=0$ and accordingly, when the small signal output current of the first MOS transistor (M3) is designated by the notation $i_{ds}$ (M3), the small signal output current is represented as follows.

$$i_{ds}(M3)=-gm_{M3}\cdot v_2 \quad (6)$$

The MOS transistor M3 is connected to the active load $i_2$ constituting the constant current source along with the MOS transistor M4 and therefore, a sum of currents flowing in the MOS transistor M3 and the MOS transistor M4 is constant. That is, a sum of a change in current is 0. Since the MOS transistor M4 is an MOS transistor of a conductive type reverse to that of the MOS transistor M3 and accordingly, the following equation is established.

$$i_{ds}(M3)+i_{sd}(M4)=0 \quad (7)$$

Therefore, when the current flowing from the active load $I_2$ to the MOS transistor M3 is changed by $i_{ds}$ (M3), the current flowing in the MOS transistor M4 connected to the active load $I_2$ constituting the constant current source is changed by $I_{sd}(M4)=-i_{ds}(M3)$. The current change is transmitted to the MOS transistor M5. Since the MOS transistor M5 is a transistor of a conductive type reverse to that of the MOS transistor M4, the following relationship is established.

$$i_{ds}(M5)=i_{sd}(M4)=-i_{ds}(M3) \quad (8)$$

The current flowing in the MOS transistor M5 brings about the change in the drain current of the MOS transistor M6 having a polarity the same as that of the MOS transistor M3 by the current mirror constituted by the MOS transistors M5 and M6 and therefore, by connecting the drain of the MOS transistor M6 to the active load $I_3$, there is provided an inverted amplified output $v_0$. When a resistance value when viewing the MOS transistor M6 and the active load $I_2$ from the drain of the MOS transistor M6 is designated by notation $R_0$ and a current ratio of the current mirror constituted by the MOS transistors M5 and M6 is designated by notation $\alpha$, the small signal alternating current output voltage $v_0$ of the drain of the MOS transistor M6 is deed as follows.

$$v_0=R_0\cdot i_{sd}(M6)=R_0\cdot\alpha\cdot i_{sd}(M5)=R_0\cdot\alpha\cdot\{-i_{ds}(M5)\}=R_0\cdot\alpha\cdot i_{ds}(M3) \therefore v_0=-(R_0\cdot\alpha\cdot gm_{M3})\cdot v_2 \quad (9)$$

The small signal alternating current output voltage $v_0$ is applied to the gate of the MOS transistor M2. It is known that the MOS transistors M3, M4, M5 and M6 and the active loads $I_2$ and $I_3$ constitute a negative feedback circuit with respect to the MOS transistor M2 since small signal alternating current voltage $v_2$ constitutes a source voltage variation of the MOS transistor M2.

A description will be given of the fact that the output operational range of the output portion of the cascode amplifying circuit comprising the MOS transistors M1 and M2, is not narrowed. When the gate voltage of the MOS transistor M3 is fixed, lowing of voltage of the node x constituting the drain of the MOS transistor M1 and constituting the source of the MOS transistor M3, signifies an increase in gate/source voltage of the MOS transistor M3. Therefore, even when an output amplitude of the output portion comprising the MOS transistors M1 and M2 is increased and the voltage of the node x is lowered, the fact does not hinder operation of the MOS transistor M3 and the output operational range of the output portion is extended to low voltage.

Further, according to the example, there is constituted a connection in the cascode type in which the drain terminal of the MOS transistor M3 is connected to the source terminal of the MOS transistor M4 and accordingly, an amplitude of voltage variation of the drain terminal of the MOS transistor M3 is small and accordingly, there is restrained the mirror effect with respect to the gate/drain capacitance of the MOS transistor M3 causing to delay response of a total of the circuit. Thereby, a reduction in response speed by the mirror effect is restrained and the cascode amplifying circuit having high-speed operation can be realized.

Figure 7:
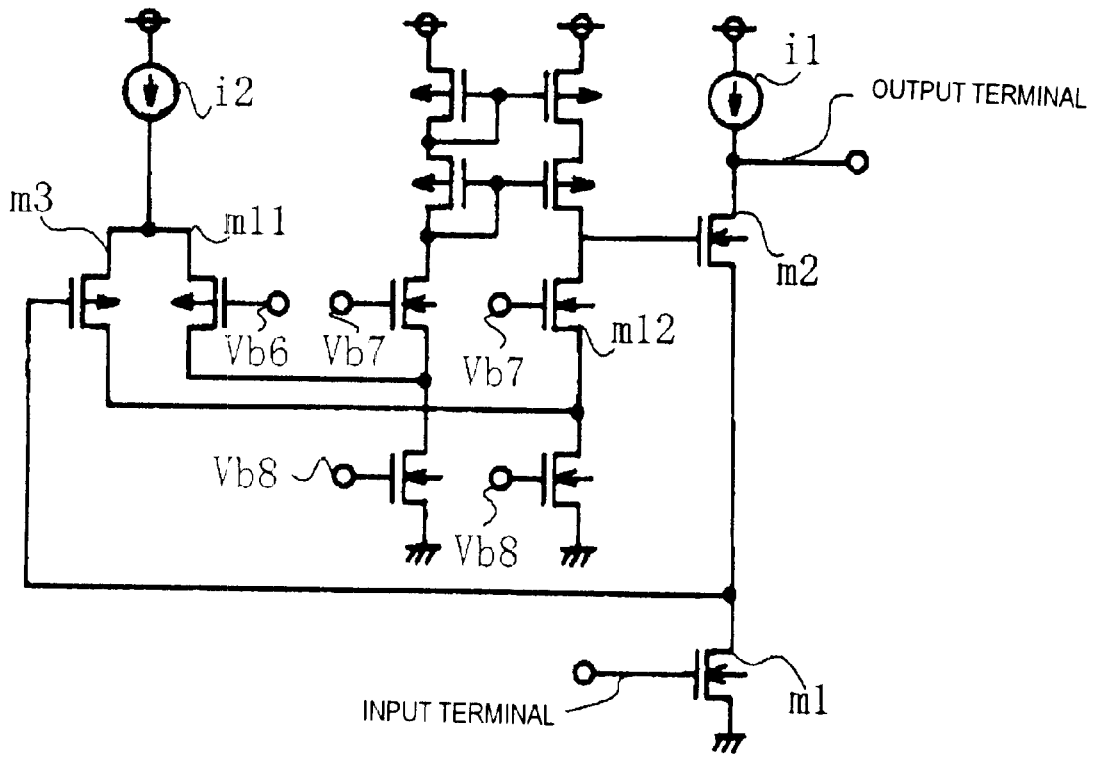
FIG. 7 is a circuit diagram showing a constitution type of a conventional cascode amplifying circuit.

As described above, according to the example, in the cascode amplifying circuit, the increase of the amplifying gain can be realized without narrowing the output operational range or delaying the response of the circuit, further, by a small number of elements. According to the example, a number of transistors of multiple stage series connection is smaller than a number of transistors of multiple stage series connection according to the conventional example of FIG. 7, which is advantageous in operation at low power source voltage. Further, in the MOS transistor M3 as the differential amplifying circuit of the example, the gate and the source function as the two differential input terminals and accordingly, there is also achieved an advantage that by the fixed biased voltage applied to the gate of the MOS transistor M3 constituting one differential input terminal, the voltage value of the source terminal of the MOS transistor M2 can be adjusted.

Figure 2:
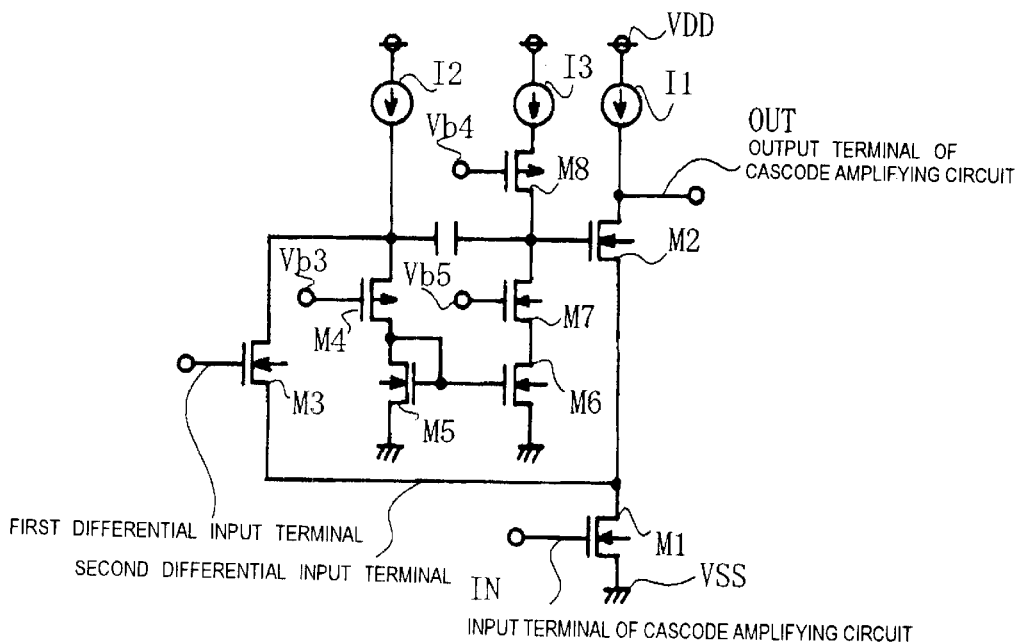
FIG. 2 is a circuit diagram showing a developed type of the cascode amplifying circuit according to the first embodiment of the invention.

Further, in the example, the amplifying gain can be increased by providing additional elements as shown by FIG. 2. In FIG. 2, notations the same as notations designated in FIG. 1 designate the same constituent elements of FIG. 1. According to the constitution of FIG. 2, in order to increase the amplifying gain of the negative feedback circuit in FIG. 1, the drain of the MOS transistor M6 is connected in series with an MOS transistor M7 of a conductive type the same as that of the MOS transistor M6, in this case, N-channel type. An MOS transistor M8 of a conductive type reverse to that of the MOS transistor M6, in this case, P-channel type, is inserted between the MOS transistor M7 and the active load $I_3$ and a common drain terminal of the MOS transistor M7 and the MOS transistor M8 is connected to the gate of the MOS transistor M2. Further, as an example of phase compensation, a capacitor Cc is connected between the drain of the MOS transistor M3 and the gate of the MOS transistor M2. The gates of the MOS transistors M7 and M8 are applied with predetermined fixed bias voltages. Even when the elements are added, the increase of the amplifying gain by using the feedback to the cascode amplifying circuit can be realized by a small number of the elements without narrowing the output operational range or delaying the response of the circuit.

Further, although according to the example, the MOS transistors of N channel type are used as the first, the second and the third MOS transistors and the MOS transistor of P-channel type is used as the fourth MOS transistor, there may be used MOS transistors of conductive types reverse thereto, respectively, P-channel type and N-channel type and in that case, MOS transistors constituting the load circuit, the inverted amplifying circuit or the like constituted by conductive types reverse thereto. The same goes with a second embodiment, mentioned later.

An explanation will be given of the second embodiment of the invention as follows.

Figure 3:
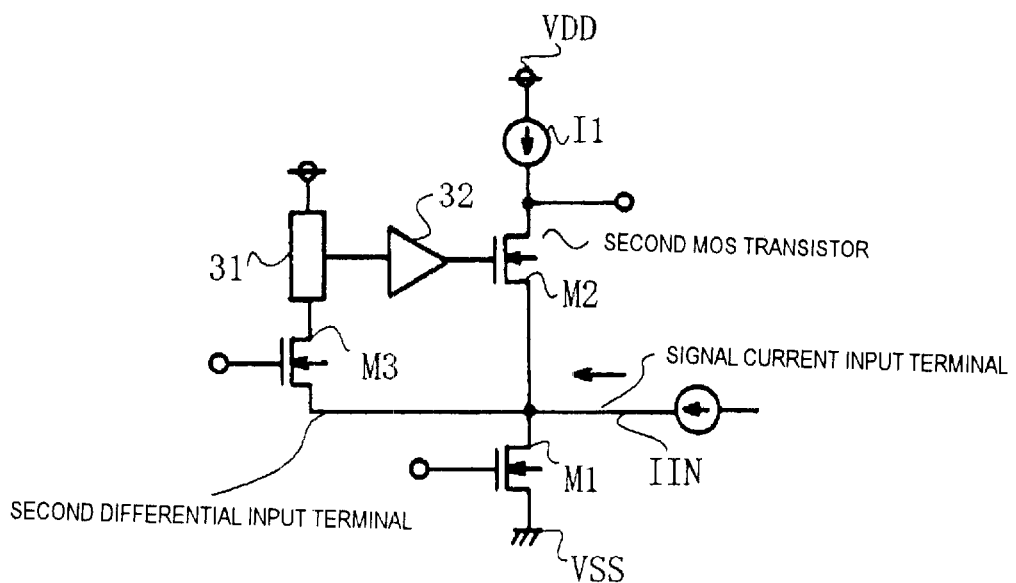
FIG. 3 is a circuit diagram showing a constitution of a cascode amplifying circuit according to a second embodiment of the invention.

Although according to the first embodiment, the gate of the MOS transistor M1 is made to constitute the input terminal and the signal voltage is applied thereto, the invention is not limited thereto but as shown by FIG. 3, there may be constituted a cascode amplifying circuit driven by signal current by adding a signal current input terminal IIN to a connection point connecting the drain of the MOS transistor M1 and the source of the MOS transistor M2. Further, in FIG. 3, the other constitutions are designated by blocks such as a load circuit 31 and an inverted amplifying circuit 32.

Figure 4:
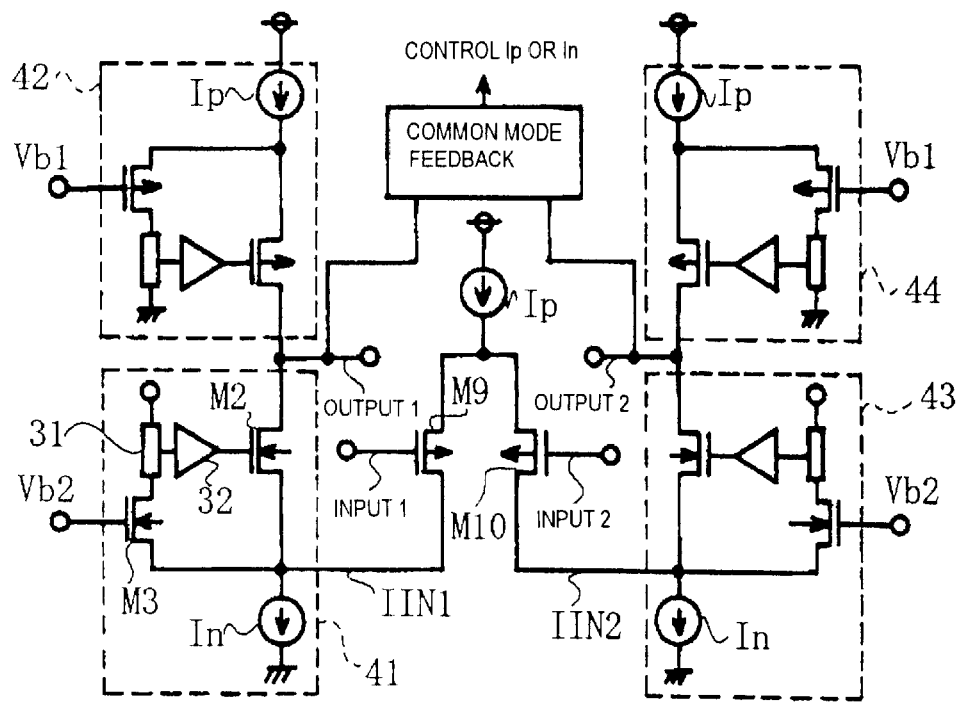
FIG. 4 is a circuit diagram showing a constitution of a folded cascode amplifying circuit applied with the cascode amplifying circuit according to the second embodiment of the invention.
Figure 5:
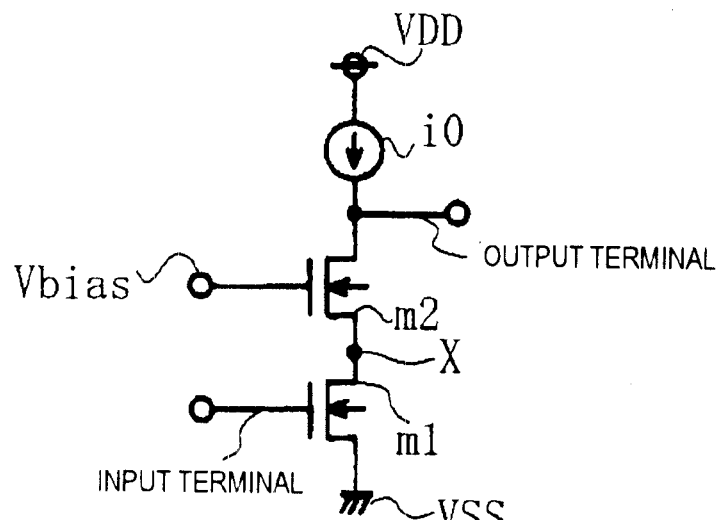
FIG. 5 is a circuit diagram showing a basic constitution type of a cascode amplifying circuit.
Figure 6:
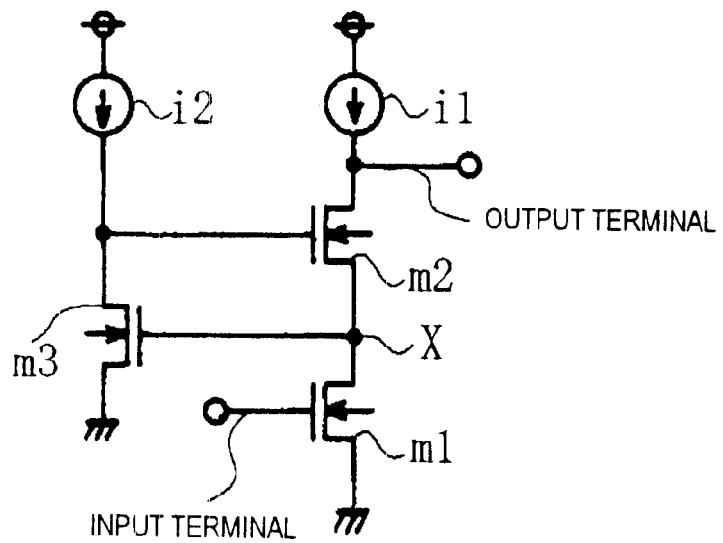
FIG. 6 is a circuit diagram showing a constitution type of a conventional cascode amplifying circuit.

The amplifying circuit shown by FIG. 3 is applicable to a folded cascode amplifying circuit as shown by FIG. 4. In FIG. 4, notations the same as notations designated in the above-illustrated respective drawings, designate constituent elements the same as those of the drawings. A cascode amplifying circuit 41 is similar to the cascode amplifying circuit shown in FIG. 3 and a current source In includes the MOS transistor M1 as the first MOS transistor and its gate is applied with pertinent bias voltage. A cascode amplifying circuit 42 is constituted by replacing the respective MOS transistors constituting the cascode amplifying circuit 41 by MOS transistors having conductive types reverse thereto and although conductivities thereof differ, similar operation and effect are achieved. According to the cascode amplifying circuit 42, the signal current input terminal IIN is abolished and the first MOS transistor is included in a current source Ip. According to the cascode amplifying circuits 41 and 42, respective output terminals are connected to thereby constitute a common output terminal OUTPUT 1. Cascode amplifying circuits 43 and 44 similar to the cascode amplifying circuits 41 and 42 are provided in mirror image. Sources of MOS transistors M9 and M10 are connected to a common current source Ip and respective gates thereof are provided with input terminals INPUT 1 and INPUT 2 to thereby constitute a differential input portion. Signal current input terminals IIN1 and IIN2 of the cascode amplifying circuits 41 and 43 are respectively connected to the drains of the MOS transistors M9 and M10. A common mode feedback circuit applies feedback control to the outputs by controlling current values of the current sources In and Ip by receiving outputs from the output terminals OUTPUT 1 and OUTPUT 2 of the cascode amplifying circuits 41 and 43. By constituting the folded cascode amplifying circuit in this way, by the above-described operation, an increase of the amplifying gain in the folded cascode amplifying circuit can be realized without narrowing the output operational range or delaying the response of the circuit, further, by a number of elements considerably smaller than that of the conventional art example.

According to the invention, the negative feedback is applied from the source to the gate of the second MOS transistor via the source and the drain of the third MOS transistor made to function as the differential amplifying circuit with the gate and the source as the two differential input terminals, the source and the drain of the fourth MOS transistor of the conductive type reverse to the conductive type of the third MOS transistor in which the source is connected to the drain of the third MOS transistor and the inverted amplifying circuit. Therefore, a wide output operational range is provided regardless of source voltage of the second MOS transistor. The third and the fourth MOS transistors constitute a connection in a cascode type. Thereby, the mirror effect with respect to the gate/drain capacitance of the third MOS transistor can be restrained and response performance of the circuit can be restrained from deteriorating.

Further, there can be realized the cascode amplifying circuit having the wide output operational range, excellent response performance of the circuit and large amplifying gain even with a small number of elements. By a reduction in the number of elements, power consumption can be restrained, large amplifying gain can be achieved and operation at low power source voltage can be carried out.

By the predetermined bias voltage applied to the gate constituting the one differential input terminal of the third MOS transistor functioning as the differential amplifying circuit, a source voltage value of the second MOS transistor can be adjusted and therefore, the output operational range can be adjusted. Further, an optimum output can be generated at a circuit on a successive stage and operational stability of a total of the circuit using the cascode amplifying circuit of the invention is promoted.

There can be realized the folded cascode amplifying circuit having a wide output operational range, excellent response performance of the circuit and large amplifying gain even with a small number of elements from the cascode amplifying circuit according to the invention.

What is claimed is:

1. A cascode amplifying circuit comprising:

a first, a second and a third MOS transistor having a same conductive type; and a fourth MOS transistor having a conductive type reverse thereto;

wherein a source of the second MOS transistor is connected to a drain of the first MOS transistor and a drain of the second MOS transistor is connected to an output terminal;

wherein there is provided a differential amplifying circuit a first differential input terminal of which is constituted by a gate of the third MOS transistor, a second differential input terminal of which is constituted by a source thereof and a differential output terminal of which is constituted by a drain thereof;

wherein there is provided a load circuit constituted by connecting a source of the fourth MOS transistor to the differential output terminal;

wherein there is provided an inverted amplifying circuit for invertedly amplifying an output from the differential output terminal via the load circuit; and wherein there is provided a negative feedback circuit from the source of the second MOS transistor to a gate thereof by applying a predetermined fixed bias voltage to the first differential input terminal, connecting the second differential input terminal to the source of the second MOS transistor and connecting the output terminal of the inverted amplifying circuit to the gate of the second MOS transistor.

2. The cascode amplifying circuit according to claim 1:

wherein an input terminal is constituted by a gate of the first MOS transistor.

3. The cascode amplifying circuit according to claim 1:

wherein an input terminal is provided to a connection point connecting the second differential input terminal of the differential amplifying circuit and the source of the second MOS transistor and a signal current is applied to the input terminal.

4. A folded cascode amplifying circuit comprising:

a first through a fourth circuit each comprising the cascode amplifying circuit according to claim 1;

wherein each of the first through the third MOS transistors in the first and the second circuits is of a first conductive type and the fourth MOS transistor is of a second conductive type reverse to the first conductive type;

wherein each of the first through the third MOS transistors in the third and the fourth circuits is of the second conductive type and the fourth MOS transistor is of the first conductive type;

wherein a first common output terminal is constituted by connecting the respective drains of the second respective MOS transistors in the first and the third circuits;

wherein a second common output terminal is constituted by connecting the respective drains of the second respective MOS transistors in the second and the fourth circuits;

wherein the respective sources of the second respective MOS transistors in the first and the second circuits or the respective sources of the second respective MOS transistors in the third and the fourth circuits are respectively connected to a first and a second input terminal;

wherein there is provided a differential circuit constituted by commonly connecting respective sources of a fifth and a sixth respective MOS transistor;

wherein respective drains of the fifth and the sixth respective MOS transistors are respectively connected to the first and the second input terminals;

wherein the fifth and the sixth respective MOS transistors are of a conductive type reverse to the conductive type of the second respective MOS transistors provided with the first and the second input terminals;

wherein a first and a second common input terminal are respectively constituted by respective gates of the fifth and the sixth respective MOS transistors; and wherein an input signal is applied to the first and the second respective common input terminals and an output signal is generated from the first and the second respective common output terminals.

* * * * *